United States Patent
Tsuchikawa et al.

(10) Patent No.: US 6,667,107 B2
(45) Date of Patent: Dec. 23, 2003

(54) THERMOSETTING RESIN COMPOSITION AND USE THEREOF

(75) Inventors: Shinji Tsuchikawa, Ibaraki-ken (JP); Kazuhito Kobayashi, Yuki (JP); Yasuyuki Mizuno, Shimodate (JP); Daisuke Fujimoto, Shimodate (JP); Nozomu Takano, Yuki (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/058,919

(22) Filed: Jan. 30, 2002

(65) Prior Publication Data
US 2002/0147277 A1 Oct. 10, 2002

(30) Foreign Application Priority Data

Jan. 30, 2001 (JP) ........................................ 2001-022266
Feb. 16, 2001 (JP) ........................................ 2001-040301

(51) Int. Cl.$^7$ .............................................. B32B 27/30
(52) U.S. Cl. .................... 428/500; 523/466; 525/333.3; 525/328.2; 525/327.4
(58) Field of Search .......................... 525/333.3, 327.4, 525/328.2; 523/466; 428/500

(56) References Cited

U.S. PATENT DOCUMENTS

| 4,780,507 A | 10/1988 | Gaku et al. |
| 5,091,476 A | 2/1992 | Monnerat |
| 6,387,990 B1 * | 5/2002 | Yeager ........................ 523/434 |

OTHER PUBLICATIONS

European Search Report EP 02 00 1902 (6/02).

* cited by examiner

Primary Examiner—Robert Dawson
Assistant Examiner—D. Aylward
(74) Attorney, Agent, or Firm—Antonelli, Terry, Stout & Kraus, LLP

(57) ABSTRACT

A thermosetting resin composition comprising (1) a copolymer resin comprising (a) a monomer unit and (b) a monomer unit respectively represented by the following general formulae (I) and (II):

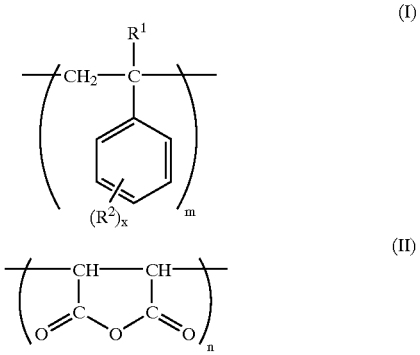

wherein $R^1$ represents hydrogen, a halogen, or a $C_1$–$C_5$ hydrocarbon group; $R^2$ represents a halogen or a $C_1$–$C_5$ hydrocarbon group; x is 0 to 3; and each of m and n is a natural number, and (2) a cyanate resin having at least two cyanate groups per molecule. To provide a printed wiring board material and a printed wiring board for electronic appliance, having a low dielectric constant and a low dielectric dissipation factor as well as improved heat resistance.

30 Claims, No Drawings

THERMOSETTING RESIN COMPOSITION AND USE THEREOF

BACKGROUND OF THE INVENTION

1. Field of the Invention

The present invention relates to a thermosetting resin composition, and a prepreg and a laminated sheet for electrically insulating material using the thermosetting resin composition.

2. Prior Art

As printed wiring boards for electronic appliance, laminated sheets mainly using an epoxy resin have been widely used. However, in accordance with tendencies that a pattern becomes finer due to the increase in the mounting density in electronic appliance, the surface mount system is generally employed, the signal propagation velocity becomes higher, and the frequency of the signal used becomes higher, a development of printed wiring board materials having a low dielectric loss and an improved heat resistance are strongly desired.

As a prior art of a resin composition or laminated sheet using an epoxy resin as a curing agent and using a copolymer resin comprising styrene and maleic anhydride, for example, Japanese Unexamined Patent Publication No. 109476/1974 has a description about a flexible printed wiring board from a flexible epoxy resin and a copolymer resin which comprises styrene and maleic anhydride, wherein a reactive epoxy diluent and an acrylonitrile-butadiene copolymer are necessary for imparting flexibility to the printed wiring board. In addition, Japanese Unexamined Patent Publication No. 221413/1989 has descriptions about a copolymer resin having an acid value of 280 or more, which is obtained from an epoxy resin, an aromatic vinyl compound, and maleic anhydride, and about an epoxy resin compound containing dicyanamide. Further, Japanese Unexamined Patent Publication No. 25349/1997 has descriptions about a prepreg and a laminated sheet material for electrical appliance, comprising a brominated epoxy resin, a copolymer resin comprising styrene and maleic anhydride (epoxy resin curing agent), a styrene compound, and a solvent. Japanese Unexamined Patent Publications No. 17685/1998 and No. 17686/1998 have descriptions about a prepreg and a laminated sheet material for electrical appliance, comprising an epoxy resin, a copolymer resin of an aromatic vinyl compound and maleic anhydride, and a phenolic compound. Japanese Unexamined national Patent Publication (kohyo) No. 505376/1998 has descriptions about a resin composition, a laminated sheet, and a printed wiring board, comprising an epoxy resin, a cross-linking agent for carboxylic anhydride-type epoxy resin, and an allyl network-forming compound. However, these prior art materials do not have performance required for the tendency that the pattern becomes finer and the frequency of the signal becomes higher, that is, they do not have low dielectric loss, excellent heat resistance, excellent moisture resistance, and excellent adhesion to a copper foil.

SUMMARY OF THE INVENTION

It is an object of the present invention to provide a thermosetting rein composition free of the above-stated problems, which composition is excellent in all, low dielectric loss, heat resistance, moisture resistance, and adhesion to a copper foil, and the use thereof, for example, a prepreg and a laminated sheet.

In one aspect, the present invention is directed to a thermosetting resin composition comprising:

(1) a copolymer resin comprising (a) a monomer unit represented by the following general formula (I):

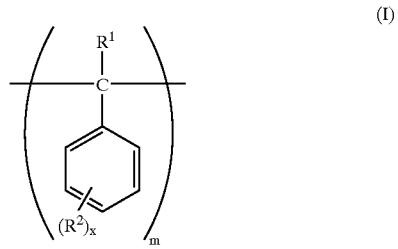

wherein $R^1$ represents a hydrogen atom, a halogen atom, or a hydrocarbon group having 1 to 5 carbon atoms; $R^2$ or each of $R^2$'s independently represents a halogen atom, an aliphatic hydrocarbon group having 1 to 5 carbon atoms, or an aromatic hydrocarbon group; x is an integer of 0 to 3, preferably 0; and m is a natural number, and (b) a monomer unit represented by the following general formula (II):

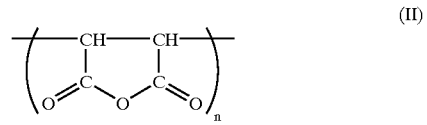

wherein n is a natural number; and (2) a thermosetting resin which is cured together with said component (1), wherein a cured product of said composition has a dielectric constant of 3.0 or less at a frequency of 1 GHz or more and has a glass transition temperature of 170° C. or more, and the composition is not constituted only by said (1).

In one aspect of the present invention, it is preferred to use a thermosetting resin composition wherein the said component (1) is replaced by (1)' a copolymer resin comprising the said monomer unit (a) and (b), and further comprises, as a monomer unit (c), N-phenylmaleimide represented by the following general formula (III):

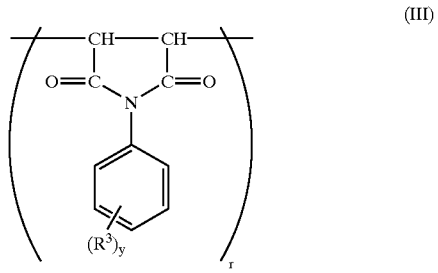

wherein $R^3$ represents a halogen atom, an aliphatic hydrocarbon group having 1 to 5 carbon atoms, an aromatic hydrocarbon group, a hydroxyl group, a thiol group, or a carboxyl group; y is an integer of 0 to 3, preferably 0; and r is a natural number, and/or a derivative thereof. In addition, it is also preferred that the component (2) a thermosetting resin is (2)' a cyanate resin having at least two cyanate groups per molecule.

In another aspect, the present invention is directed to a thermosetting resin composition comprising:

(1) a copolymer resin comprising
(a) a monomer unit represented by the following general formula (I):

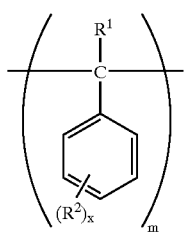

(I)

wherein $R^1$ represents a hydrogen atom, a halogen atom, or a hydrocarbon group having 1 to 5 carbon atoms; $R^2$ or each of $R^2$'s independently represents a halogen atom, an aliphatic hydrocarbon group having 1 to 5 carbon atoms, an aromatic hydrocarbon group, or a hydroxyl group; x is an integer of 0 to 3, preferably 0; and m is a natural number, and (b) a monomer unit represented by the following general formula (II):

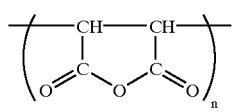

(II)

wherein n is a natural number; and (2)' a cyanate resin having at least two cyanate groups per molecule.

In another aspect of the present invention, it is preferred to use a thermosetting resin composition wherein the said component (1) is replaced by (1)' a copolymer resin comprising the said monomer unit (a) and (b), and further comprises, as a monomer unit (c), N-phenylmaleimide represented by the following general formula (III):

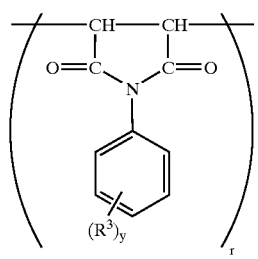

(III)

wherein $R^3$ represents a halogen atom, an aliphatic hydrocarbon group having 1 to 5 carbon atoms, an aromatic hydrocarbon group, a hydroxyl group, a thiol group, or a carboxyl group; y is an integer of 0 to 3, preferably 0; and r is a natural number and/or a derivative thereof.

DESCRIPTION OF THE PREFERRED EMBODIMENTS

Hereinafter, the present invention will be described in more detail.

In the present invention, component (1) or (1)' is a copolymer resin comprising styrene and maleic anhydride. In the present invention, the monomer unit (a) is obtained from a compound, such as styrene, 1-methylstyrene, vinyltoluene, dimethylstyrene, chlorostyrene, or bromostyrene, and these compounds can be used individually or in combination. Further, various polymerizable components other than the above-stated monomer units may be copolymerized, and examples of these polymerizable components include vinyl compounds, such as ethylene, propylene, butadiene, isobutylene, acrylonitrile, vinyl chloride, and fluoroethylene, and compounds having a methacryloyl group or an acryloyl group, such as methacrylate such as methyl methacrylate, and acrylate such as methyl acrylate. A substituent, such as an allyl group, a methacryloyl group, an acryloyl group, or a hydroxyl group, can be optionally introduced into the component (a) through a Friedel-Crafts reaction or a reaction using a metal catalyst, such as lithium.

In the present invention, various hydroxyl group-containing compounds, amino group-containing compounds, cyanate group-containing compounds, and epoxy group-containing compounds can be introduced into the monomer unit (b).

In the present invention, as the monomer units (c), preferred are N-phenylmaleimide and derivatives of N-phenylmaleimide, which have a phenolic hydroxyl group, from the viewpoint of obtaining excellent dielectric property and an appropriate glass transition temperature, and especially preferred is N-phenylmaleimide from the viewpoint of obtaining excellent heat resistance and excellent moisture resistance. Examples of derivatives of N-phenylmaleimide include compounds represented by general formulae (IV) to (IX):

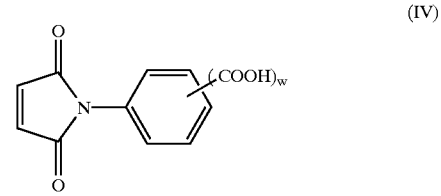

(IV)

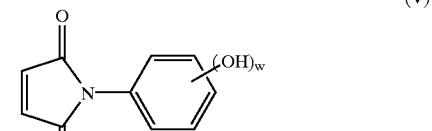

(V)

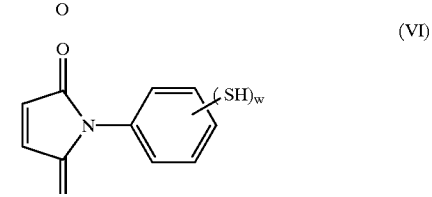

(VI)

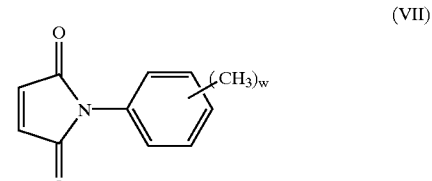

(VII)

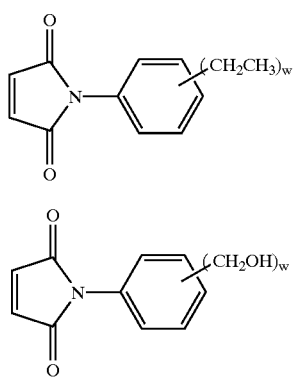

(VIII)

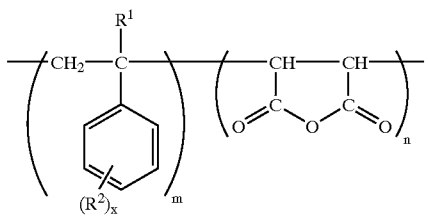

(IX)

wherein w or each of w's independently represents an integer of 1 to 3.

In the present invention, it is preferred that the component (1) is a copolymer resin represented by the following general formula (X):

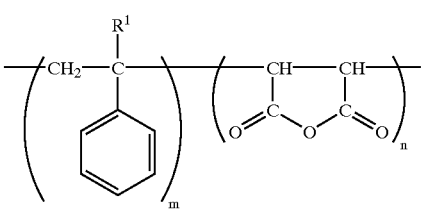

(X)

wherein $R^1$, $R^2$, m, n and x have the same meanings as stated above. The examples of $R^1$ includes a hydrogen atom, a halogen atom, or a hydrocarbon group having 1 to 5 carbon atoms, preferably a hydrogen atom or a methyl group. The examples of $R^2$ or each of $R^2$'s include a halogen atom, an aliphatic hydrocarbon group having 1 to 5 carbon atoms, an aromatic hydrocarbon group including a group which forms a naphthalene together with the benzene entity of the monomer (a), or a hydroxyl, preferably a hydrogen atom or a methyl group.

In the present invention, it is preferred that the component (1) is a copolymer resin represented by the following general formula (XI):

(XI)

wherein $R^1$, m and n have the same meanings as stated above.

In the present invention, from the viewpoint of achieving a good balance of a dielectric constant and a dielectric dissipation factor with a glass transition temperature, resistance to soldering heat, and adhesion to a copper foil, it is preferred that m/n indicating the copolymerization ratio for component (1) is 0.8 to 19.

In the present invention, it is preferred that the component (1)' is a copolymer resin represented by the following general formula (XII):

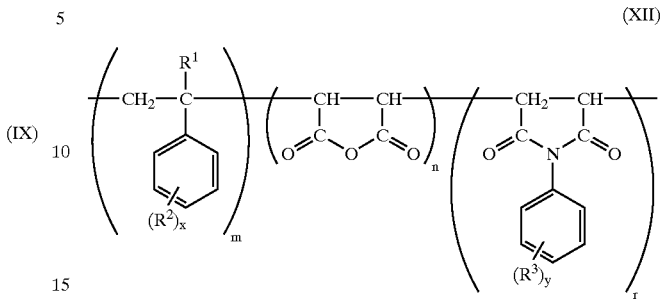

(XII)

wherein $R^1$, $R^2$, $R^3$, m, n, r, x and y have the same meanings as stated above. The examples of $R^3$ includes a halogen atom, an aliphatic hydrocarbon group having 1 to 5 carbon atoms, an aromatic hydrocarbon group including a group which forms a naphthalene together with the benzene entity of the monomer (c), a hydroxyl group, a thiol group, or a carboxyl group, preferably a hydrogen atom or a methyl group.

In the present invention, it is more preferred that component (1)' is a copolymer resin represented by the following general formula (XIII):

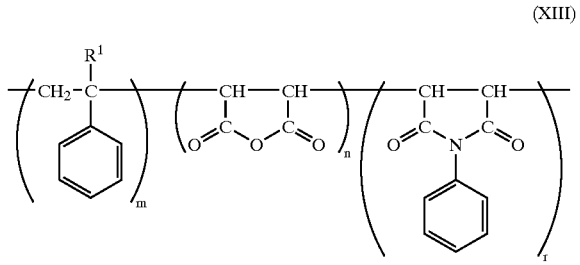

(XIII)

wherein $R^1$, m, n and r have the same meanings as stated above.

In the present invention, from the viewpoint of achieving a good balance of a dielectric constant and a dielectric dissipation factor with a glass transition temperature, resistance to soldering heat, and adhesion to a copper foil, it is preferred that m/(n+r) indicating the copolymerization ratio for the component (1)' is 0.8 to 19, and it is more preferred that the ratio is from 1 to 3.

In the present invention, from the viewpoint of achieving a good balance of a dielectric constant and a dielectric dissipation factor with a glass transition temperature, resistance to soldering heat, and adhesion to a copper foil, it is preferred that n/r indicating the copolymerization ratio for the component (1)' is 1/49 to 49, and it is more preferred that the ratio is from 1/9 to 9.

In addition, from the viewpoint of achieving a good balance of heat resistance and a mechanical strength with formability at 200° C. or lower, it is preferred that the weight average molecular weight of the component (1) or (1)' is 1,000 to 300,000. The weight average molecular weight is measured by gel permeation chromatography using tetrahydrofuran as a solvent, in which a standard polystyrene is used for molecular weight calibration.

In the present invention, a resin cured product, which comprises the component (1) or (1)' and a thermosetting resin, has preferably a dielectric constant of 3.0 or less at a frequency of 1 GHz or more and has a glass transition temperature of 170° C. or more. From the viewpoint of achieving a good balance of low dielectric loss with heat resistance and moisture resistance, the dielectric constant is more preferably 2.2 to 3.0, especially preferably 2.4 to 2.9. From the viewpoint of achieving a good balance of heat resistance with incorporation of a resin component, moisture resistance, and low dielectric loss, the glass transition temperature is more preferably 170 to 230° C., especially preferably 175 to 220° C.

For obtaining a resin cured product containing the above copolymer resin, which has a dielectric constant adjusted to be 3.0 or less and has a glass transition temperature of 170° C. or more, the resin composition of the present invention contains, in addition to the component (1) or (1)', a thermosetting resin component which is cured together with the copolymer resin. As such a component, a resin having a low dielectric constant and a high glass transition temperature, which is cured together with the copolymer resin, can be used, and, by combining this resin with the component (1) or (1)' in the present invention, a composition having a dielectric constant of 3.0 or less and having a glass transition temperature of 170° C. or more can be obtained.

In the present invention, there is no particular limitation with respect to (2) a thermosetting resin provided that the resin achieves the object of the present invention. Examples of the thermosetting resin include a cyanate resin having two or more cyanate groups per molecule.

In an example of the present invention, specific examples of cyanate compounds for (2)' a cyanate resin include 2,2-di(cyanatephenyl)propane, di(4-cyanate-3,5-dimethylphenyl)methane, di(4-cyanatephenyl)thioether, 2,2-di(4-cyanatephenyl)hexafluoropropane, di(cyanatephenyl)ethane, and a cyanate and a phenolic novolak cyanate of a copolymer of phenol and dicyclopentadiene, and these compounds can be used individually or in combination. Of these, more preferred is 2,2-di(cyanatephenyl)propane from the viewpoint of obtaining excellent dielectric property and excellent heat resistance, further preferred is a compound containing a mixture of a trimer and a larger oligomer (polymer) having a triazine ring preliminarily formed by self-polymerization, and, from the viewpoint of achieving a good balance of a dielectric constant and a dielectric dissipation factor with heat resistance and prevention of gelation, especially preferred is a compound in which 10 to 90 mol % of 2,2-di (cyanatephenyl)propane forms a trimer and/or a larger oligomer (polymer).

When a trimer and/or a larger oligomer (polymer) having a triazine ring is formed by self-polymerization, it is effective that a cyanate resin is preliminarily mixed with the component (1) and dissolved to form a semi-interpenetrating polymer network (semi-IPN) structure between the component (1) and a trimer and/or a larger polymer having a triazine ring derived from the cyanate resin, and, by virtue of having the semi-IPN structure, the resin composition can be improved in glass transition temperature, adhesion to a copper foil, and dielectric property.

Examples of curing catalysts for (2)' the cyanate resin include organometal catalysts, such as zinc naphthenate, manganese naphthenate, and titanium naphthenate, and examples of curing accelerators include monohydric phenolic compounds, such as phenol, nonylphenol, and para-cumylphenol, and polyhydric phenolic compounds, such as bisphenol A and phenol novolak resins. Among these curing catalysts, preferred are zinc naphthenate and manganese naphthenate from the viewpoint of obtaining excellent dielectric property and excellent heat resistance, and especially preferred is zinc naphthenate from the viewpoint of obtaining a high reaction rate of the heat curing reaction. It is preferred that the amount of the curing catalyst used is 0.01 to 1.00% by weight, based on the weight of the cyanate resin from view point of achieving a good balance of a high reaction rate of the heat curing reaction, excellent dielectric property and excellent heat resistance with occurrence of gelation during the synthesis and lack of stability in resultant varnish. As the curing accelerator, monohydric phenolic compounds are preferred from the viewpoint of obtaining excellent heat resistance, and especially preferred is para-cumylphenol from the viewpoint of obtaining excellent dielectric property and excellent heat resistance. It is preferred that the amount of the curing accelerator used is 0.01 to 1.00, in terms of the ratio of the equivalent amount of phenolic hydroxyl group to the equivalent amount of cyanate group in the cyanate resin.

From the viewpoint of achieving a good balance between a glass transition temperature, resistance to soldering heat, adhesion to a copper foil, a dielectric constant, and a dielectric dissipation factor, the thermosetting resin composition of the present invention preferably comprises 10 to 300 parts by weight of component (2), more preferably comprises 50 to 300 parts by weight of the component (2), especially preferably comprises 50 to 250 parts by weight of the component (2) per 100 parts by weight of component (1) or (1)'.

In the present invention, as component (3), well known epoxy resins, curing agents for epoxy resins, curing accelerators for epoxy resins, isocyanurate compounds and curing catalysts therefore, thermoplastic resins, elastomers, flame retardants, and filler can be optionally used individually or in combination.

In the present invention, it is preferred that an epoxy resin of the component (3) is used as a modifier. By adding the epoxy resin to the composition, the resultant resin composition is improved in moisture resistance and heat resistance, especially in heat resistance after absorbing water. The epoxy resin can be added to the resin composition in an amount of 0 to 300 parts by weight, relative to 100 parts by weight of the component (1). With respect to the component (3), there is no particular limitation as long as it is an epoxy resin having two or more epoxy groups per molecule, and examples include bisphenol A glycidyl ether, bisphenol F glycidyl ether, biphenyl glycidyl ether, novolak glycidyl ether, multifunctional phenolic glycidyl ether, naphthalene glycidyl ether, alicyclic glycidyl ether, alcohol glycidyl ether, and halides of these glycidyl ethers, glycidyl amines, and glycidyl esters, and these can be used individually or in combination. Of these, from the viewpoint of obtaining excellent dielectric property and excellent heat resistance, preferred are dicyclopentadiene-type epoxy resins, bisphenol A novolak-type epoxy resins, biphenyl-type epoxy resins, tetrabromobisphenol A-type epoxy resins, and polydimethylsiloxane-containing epoxy resins, and especially preferred are dicyclopentadiene-type epoxy resins, biphenyl-type epoxy resins, and bisphenol A novolak-type epoxy resins from the viewpoint of obtaining excellent moisture resistance and excellent adhesion to a copper foil.

In the present invention, examples of curing agents for epoxy resins include acid anhydrides, amine compounds, and phenolic-compounds. Examples of curing accelerators for epoxy resins include imidazoles and derivatives thereof, tertiary amines, and quaternary ammonium salts.

In the present invention, examples of isocyanurate compounds include triallyl isocyanurate, trimetaallyl isocyanurate, diallylmonoglycidyl isocyanurate, monoallyl-diglycidyl isocyanurate, triacryloylethyl isocyanurate, and trimethacryloylethyl isocyanurate. Of these, from the viewpoint of achieving low-temperature curing property, preferred are triallyl isocyanurate and triacryloylethyl isocyanurate. From the viewpoint of obtaining excellent dielectric property, especially preferred is triallyl isocyanurate. Examples of curing catalysts include organic peroxides, such as benzoyl peroxide and 2,5-dimethyl-2,5-di(t-butylperoxy)-3-hexene-3, which are radical initiators.

In the present invention, examples of thermoplastic resins include polytetrafluoroethylene, polyethylene, polypropylene, polystyrene, polyphenylene ether reins, phenoxy resins, polycarbonate resins, polyester resins, polyamide resins, polyimide resins, xylene resins, petroleum resins, and silicone resins.

In the present invention, examples of elastomers include polybutadiene, polyacrylonitrile, epoxy-modified polybutadiene, maleic anhydride-modified polybutadiene, phenol-modified polybutadiene, and carboxy-modified poly-acrylonitrile.

In the present invention, examples of flame retardants include halogen flame retardants, such as hexabromobenzene, brominated polycarbonate, brominated epoxy resins, and brominated phenolic resins; phosphate flame retardants, such as tricresyl phosphate and tris(dichloropropyl) phosphate; and inorganic flame retardants, such as red phosphorus, antimony trioxdie, aluminum hydroxide, and magnesium hydroxide.

In the present invention, examples of the filler include inorganic substance powder, such as silica, mica, talc, glass short fiber or fine powder, and hollow glass, and organic substance powder, such as silicone powder, polytetrafluoroethylene, polyethylene, polypropylene, polystyrene, and polyphenylene ether.

In the present invention, an organic solvent can be optionally used, and there is no particular limitation with respect to the organic solvent. Examples of organic solvents include ketone solvents, such as acetone, methyl ethyl ketone, methyl isobutyl ketone, and cyclohexanone; alcohol solvents, such as ethylene glycol monomethyl ether; ether solvents, such as tetrahydrofuran; aromatic solvents, such as toluene, xylene, and mesitylene; dimethylformamide; dimethylacetamide; and N-methylpyrrolidone, and these organic solvents can be used individually or in combination.

In the present invention, an ultraviolet absorber, an antioxidant, a photopolymerization initiator, a fluorescent brightener, and an adhesion improving agent can be optionally added to the resin composition, and there is no particular limitation with respect to these additives. Examples of ultraviolet absorbers include benzotriazoles; examples of antioxidants include hindered phenol and styrenated phenol; examples of photopolymerization initiators include benzophenones, benzylketals, and thioxanthone; examples of fluorescent brighteners include stilbene derivatives; and examples of adhesion improving agents include urea compounds, such as urea silane, and silane coupling agents.

The prepreg of the present invention comprises a base material impregnated or coated with the above-stated thermosetting resin composition of the present invention. The prepreg of the present invention is described below in detail.

The prepreg of the present invention can be produced by impregnating or coating a base material with the thermosetting resin composition, which comprises the component (1) or (1)' and the component (2), and optionally the component (3), then semicuring the resin composition (so as to be in a B-stage) by, for example, heating. As the base material in the present invention, well known ones for use in various laminated sheets for electrically insulating material can be used. Examples of materials for the base material include inorganic fiber, such as E-glass, D-glass, S-glass, and Q-glass, organic fiber, such as polyimide, polyester, and polytetrafluoroethylene, and mixtures thereof. These base materials have forms of, for example, woven fabric, non-woven fabric, roving, chopped strand mat, and surfacing mat, but the material and forms of the base material are appropriately selected depending on the application and performance of a desired shaped product, and, if desired, two or more materials and forms can be used individually or in combination. With respect to the thickness of the base material, there is no particular limitation, and, for example, a base material having a thickness of about 0.03 to 0.5 mm can be used. From the viewpoint of achieving excellent heat resistance and excellent moisture resistance as well as excellent processability, a base material having a surface treated with a silane coupling agent or a base material treated by mechanically splitting is preferred. A base material is impregnated or coated with the resin composition so that the content of the resin in the prepreg dried becomes from 20 to 90% by weight, and then, generally dried by heating at 100 to 200° C. for 1 to 30 minutes to semicure the resin composition (so as to be in a B-stage) to obtain the prepreg of the present invention.

Subjecting the above-stated prepreg of the present invention to laminate molding can form the laminated sheet of the present invention. The laminated sheet can be produced by, for example, stacking on one another 1 to 20 pieces of the prepreg of the present invention, placing on one surface or both surfaces of the stacked prepreg a metal foil or metal foils of copper or aluminum, and subjecting the resultant prepreg to laminate molding. With respect to the type of metal foil, there is no particular limitation as long as it can be used in the application of electrically insulating materials. In addition, as conditions for molding, for example, those used in methods for laminated sheet and multilayer sheet for electrically insulating materials can be employed, and, for example, molding can be conducted using a multi-stage press, a multi-stage vacuum press, a continuous molding machine, or an autoclave molding machine by heating at 100 to 250° C. at a pressure of 2 to 100 kg/cm$^2$ for 0.1 to 5 hours. Further, the prepreg of the present invention can be combined with a wiring board for inner layer and subjected to laminate molding to produce a multilayer sheet.

EXAMPLES

Hereinafter, the present invention will be described in more detail with reference to the following Examples, which should not be construed as limiting the scope of the present invention. In the following Examples, "part(s)" is given by part(s) by weight unless otherwise specified.

Synthesis Example 1

Component (1): Preparation of Copolymer Resin Solution (1-1)

Into a reactor equipped with a thermometer, a stirrer, and a reflux condenser, being capable of heating and cooling and having a capacity of 2 liters, were placed 410 g of a copolymer resin comprising styrene and maleic anhydride (trade name: SMA1000; manufactured by Elf Atochem; m/n in formula (X) is 1.3; weight average molecular weight: 8,000) and 273 g of cyclohexanone, and heated to 150 to 160° C. under reflux for 24 hours. Then, the resultant mixture was cooled to about 100° C., and 398 g of toluene was added thereto to obtain a copolymer resin solution (1-1) (solid content: 38% by weight).

Synthesis Example 2

Component (1): Preparation of Copolymer Resin Solution (1-2)

Into a reactor equipped with a thermometer, a stirrer, and a reflux condenser, being capable of heating and cooling and having a capacity of 2 liters, were placed 410 g of a copolymer resin comprising styrene and maleic anhydride (trade name: SMA2000; manufactured by Elf Atochem; m/n in the formula (X) is 2.0; weight average molecular weight: 9,000) and 273 g of cyclohexanone, and heated to 150 to 160° C. under reflux for 24 hours. Then, the resultant mixture was, cooled to about 100° C., and 398 g of toluene was added thereto to obtain a copolymer resin solution (1-2) (solid content: 39% by weight).

Synthesis Example 3

Component (1): Preparation of Copolymer Resin Solution (1-3)

Into a reactor equipped with a thermometer, a stirrer, and a reflux condenser, being capable of heating and cooling and having a capacity of 2 liters, were placed 410 g of a copolymer resin comprising styrene and maleic anhydride (trade name: SMA3000; manufactured by Elf Atochem; m/n in formula (X) is 3.0; weight average molecular weight: 10,000) and 273 g of cyclohexanone, and heated to 150 to 160° C. under reflux for 24 hours. Then, the resultant mixture was cooled to about 100° C., and 398 g of toluene was added thereto to obtain a copolymer resin solution (1-3) (solid content: 38% by weight).

Synthesis Example 4

Component (1)': Preparation of Copolymer Resin Solution (1-4)

Into a reactor equipped with a thermometer, a stirrer, and a water-content keeping apparatus having a reflux condenser, being capable of heating and cooling and having a capacity of 2 liters, were placed 410 g of a copolymer resin comprising styrene and maleic anhydride (trade name: SMA3000; manufactured by Elf Atochem) and 273 g of mesitylene, and heated to 110° C., and then 46.5 g of aniline was added thereto dropwise while maintaining the temperature of the resultant mixture at 107 to 113° C. After completion of the addition of aniline, a reaction was effected at 110° C. for 4 hours, and then, the reaction mixture was heated to 165° C. and reacted under reflux for 12 hours. Then, the reaction mixture was cooled to about 100° C., and 398 g of toluene was added thereto to obtain a solution (1-4) of a copolymer resin comprising styrene, maleic anhydride, and N-phenylmaleimide. The solid content of the solution (1-4) was 40% by weight, and a copolymerization ratio among styrene, maleic anhydride, and N-phenylmaleimide was such that m/(n+r) is 3 and n/r is 1 in the component (1-4). The weight average molecular weight was 10,000.

Synthesis Example 5

Component (1)': Preparation of Copolymer Resin Solution (1-5)

Into a reactor equipped with a thermometer, a stirrer, and a water-content keeping apparatus having a reflux condenser, being capable of heating and cooling and having a capacity of 1 liter, were placed 202 g of a copolymer resin comprising styrene and maleic anhydride (trade name: SMA1000; manufactured by Elf Atochem) and 134 g of cyclohexanone, and heated to 100° C., and then 46.5 g of aniline was added thereto dropwise while maintaining the temperature of the resultant mixture at 97 to 103° C. After completion of the addition of aniline, a reaction was effected at 100° C. for 4 hours, and then, the reaction mixture was heated to 155 to 160° C. and reacted under reflux for 12 hours. Then, the reaction mixture was cooled to about 100° C., and 159 g of toluene was added thereto to obtain a solution (1-5) of a copolymer resin comprising styrene, maleic anhydride, and N-phenylmaleimide. The solid content of the solution (1-5) was 45% by weight, and a copolymerization ratio among styrene, maleic anhydride, and N-phenylmaleimide was such that m/(n+r) is 1 and n/r is 1 in the component (1-5). The weight average molecular weight was 9,000.

Synthesis Example 6

Component (1)': Preparation of Copolymer Resin Solution (1-6)

Into a reactor equipped with a thermometer, a stirrer, a condenser, and a nitrogen gas introducing tube, being capable of heating and cooling and having a capacity of 2 liters, were placed 104 g of styrene, 19.6 g of maleic anhydride, 138.4 g of N-phenylmaleimide, 4.0 g of azobisisobutyronitrile, 0.4 g of dodecanethiol, 193 g of methyl ethyl ketone, and 200 g of toluene, and the resultant mixture was subjected to polymerization reaction in a nitrogen gas atmosphere at 70° C. for 4 hours to obtain a solution (1-6) of a copolymer resin comprising styrene, maleic anhydride, and N-phenylmaleimide. The solid content of the solution (1-6) was 41% by weight, and a copolymerization ratio among styrene, maleic anhydride, and N-phenylmaleimide was such that m/(n+r) is 1 and n/r is 1/4 in the component (I). The weight average molecular weight was 20,000.

Synthesis Example 7

Component (1): Preparation of Copolymer Resin (1-7)

Into a reactor equipped with a thermometer, a stirrer, and a water-content keeping apparatus having a reflux condenser, being capable of heating and cooling and having a capacity of 2 liters, were placed 410 g of a copolymer resin comprising styrene and maleic anhydride (trade name: Dylark D-232; manufactured by Dylark) and 273 g of cyclohexanone, and heated to 150 to 160° C. under reflux for 2 hours to remove water therefrom. Then, the resultant mixture was cooled to about 100° C., and 398 g of toluene was added thereto to obtain a solution (1-7) of a copolymer resin styrene and maleic anhydride. The solid content of the solution (1-7) was 38% by weight, and a copolymerization ratio between styrene and maleic anhydride was such that m/n is 11.5 in component (1-7). The weight average molecular weight was 200,000.

Synthesis Example 8

Component (1): Preparation of Copolymer Resin (1-8)

Into a reactor equipped with a thermometer, a stirrer, and a water-content keeping apparatus having a reflux condenser, being capable of heating and cooling and having a capacity of 2 liters, were placed 410 g of a copolymer resin comprising styrene and maleic anhydride (trade name: Dylark D-332; manufactured by Dylark) and 273 g of cyclohexanone, and heated to 150 to 160° C. under reflux for 2 hours to remove water therefrom. Then, the resultant mixture was cooled to about 100° C., and 398 g of toluene was added thereto to obtain a solution (1-8) of a copolymer resin comprising styrene and maleic anhydride. The solid content of the solution (1-8) was 38% by weight, and a copolymerization ratio between styrene and maleic anhydride was such that m/n is 7.0 in the component (1-8). The weight average molecular weight was 150,000.

Synthesis Example 9

Component (2): Preparation of Cyanate Resin (2-1)

Into a reactor equipped with a thermometer, a stirrer, and a condenser, being capable of heating and cooling and having a capacity of 3 liters, were placed 1,519 g of 2,2-di(cyanatephenyl)propane, 23.1 g of para-cumylphenol, and 1,022 g of toluene, and the mixture was heated to 80° C., and 0.22 g of an 8 wt % solution of zinc naphthenate was added thereto while maintaining the temperature of the resultant mixture at 77 to 83° C. After completion of the addition of the solution, a reaction was effected at 80° C. for 3.5 hours to obtain a solution (2-1) of a cyanate resin. The solid content of the solution (2-1) was 61% by weight, and a measurement using gel permeation chromatography confirmed that 45 mol % of 2,2-di(cyanatephenyl)propane, which is the raw material, formed a trimer and/or a larger polymer by self-polymerization.

Synthesis Example 10

Component (2): Preparation of Cyanate Resin (2-2)

Into a reactor equipped with a thermometer, a stirrer, and a condenser, being capable of heating and cooling and having a capacity of 3 liters, were placed 1,519 g of 2,2-di(cyanatephenyl)propane, 23.1 g of para-cumylphenol, and 1,022 g of toluene, and the mixture was heated to 80° C., and 0.22 g of an 8 wt % solution of zinc naphthenate was added thereto while maintaining the temperature of the resultant mixture at 77 to 83° C. After completion of the addition of the solution, a reaction was effected at 80° C. for 1 hour to obtain a solution (2-2) of a cyanate resin. The solid content of the solution (2-2) was 61% by weight, and a measurement using gel permeation chromatography confirmed that 20 mol % of 2,2-di(cyanatephenyl)propane, which is the raw material, formed a trimer and/or a larger polymer by self-polymerization.

Synthesis Example 11

Preparation of Semi-IPN of Component (1) and (2)

Into a reactor equipped with a thermometer, a stirrer, and a condenser, being capable of heating and cooling and having a capacity of 5 liters, were placed 1,519 g of 2,2-di(cyanatephenyl)propane, 23.1 g of para-cumylphenol, 1,519 g of a copolymer resin comprising styrene and maleic anhydride (trade name: Dylark D-332; manufactured by Dylark), and 1,022 g of toluene, and the mixture was heated to 100° C. to dissolve the solids in the solvent. After dissolution, 0.88 g of an 8 wt % solution of zinc naphthenate was added to the resultant solution while maintaining the temperature of the resultant mixture at 97 to 103° C. After completion of the addition of the solution, a reaction was effected at 120° C. for 5 hours to obtain a solution (2-3) of a resin having a semi-IPN (interpenetrating polymer network) structure among the copolymer resin comprising styrene and maleic anhydride, and a trimer and/or a larger polymer having a triazine ring derived from the cyanate resin. The solid content of the solution (2-3) was 67% by weight, and a measurement using gel permeation chromatography confirmed that 60 mol % of 2,2-di(cyanatephenyl)propane, which is the raw material, formed a trimer and/or a larger polymer by self-polymerization. A copolymerization ratio between styrene and maleic anhydride was such that m/n is 7.0 in the component (1).

Comparative Synthesis Example 1

Preparation of Styrene Resin (a-1)

Into a reactor equipped with a thermometer, a stirrer, a condenser, and a nitrogen gas introducing tube, being capable of heating and cooling and having a capacity of 2 liters, were placed 277 g of styrene, 4.0 g of azobisisobutyronitrile, 0.4 g of dodecanethiol, 216 g of methyl ethyl ketone, and 200 g of toluene, and the resultant mixture was subjected to polymerization reaction in a nitrogen gas atmosphere at 70° C. for 4 hours to obtain a solution (a-1) of a styrene resin. The solid content of the solution (a-1) was 41% by weight. The weight average molecular weight was 20,000.

Comparative Synthesis Example 2

Preparation of Comparative Copolymer Resin (a-2)

Into a reactor equipped with a thermometer, a stirrer, a condenser, and a nitrogen gas introducing tube, being capable of heating and cooling and having a capacity of 2 liters, were placed 104 g of styrene, 173 g of N-phenylmaleimide, 4.0 g of azobisisobutyronitrile, 0.4 g of dodecanethiol, 216 g of methyl ethyl ketone, and 200 g of toluene, and the resultant mixture was subjected to polymerization reaction in a nitrogen gas atmosphere at 70° C. for 4 hours to obtain a solution (a-2) of a copolymer resin comprising styrene and N-phenylmaleimide. The solid content of the solution (a-2) was 41% by weight, and a copolymerization ratio between styrene and N-phenylmaleimide was 1:1. The weight average molecular weight was 200,000.

EXAMPLES 1 to 12 COMPARATIVE EXAMPLES 1 to 9

Those obtained from Synthesis Examples 1 to 8 (1-1 to 1-8) and Comparative Synthesis Examples 1 and 2 (a-1 or a-2), Synthesis Examples 9 and 10 (2-1 or 2-2), Synthesis Example 11 (semi-IPN), optionally component (3) epoxy resin and/or isocyanurate compound, and triethylamine, zinc naphthenate, 2,5-dimethyl-2,5-di(t-butylperoxy)-3-hex-3-en and para-cumylphenol as curing reaction catalysts were mixed together in accordance with the formulations (part(s) by weight) shown in Tables 1 to 4 to obtain uniform varnishes. E-glass cloth having a thickness of 0.1 mm was impregnated with each of the above-obtained varnishes, and dried by heating at 160° C. for 10 minutes to obtain a prepreg having a resin-content of 55% by weight.

Then, four pieces of each prepreg were stacked on one another, and disposed between 18 μm electrolytic copper foils and pressed at a pressure of 25 kg/cm² at 185° C. for 90 minutes to obtain a copper-clad laminated sheet. Using the thus obtained copper-clad laminated sheet, a dielectric constant (1 GHz), a dielectric dissipation factor (1 GHz), a moisture absorption (water absorption), resistance to soldering heat, adhesion (peel strength), and a glass transition temperature were measured or evaluated according to the following methods.

(1) Measurement of Dielectric Constant and Dielectric Dissipation Factor

The obtained resin sheets and copper-clad laminated sheets were individually immersed in a copper etching liquid to remove the copper foils to obtain specimens for evaluation, and a dielectric constant and a dielectric dissipation factor of each specimen were measured at a frequency of 1 GHz using a dielectric constant measurement apparatus (trade name: HP4291B), manufactured by Hewlett-Packard Company.

(2) Evaluation of Moisture Absorption (Water Absorption)

The copper-clad laminated sheets were individually immersed in a copper etching liquid to remove the copper foils to obtain specimens for evaluation, and the obtained specimens were individually subjected to pressure cooker treatment at 121° C. at 2 atm. for 4 hours using a pressure cooker test machine, manufactured by Hirayama Corporation, and then a moisture absorption of each of the resultant specimens was measured.

(3) Evaluation of Resistance to Soldering Heat

The copper-clad laminated sheets were individually immersed in a copper etching liquid to remove the copper foils to obtain specimens for evaluation, the obtained specimens were individually immersed in a solder bath at 288° C. for 20 seconds, and then resistance to soldering heat of each of the resultant specimens was evaluated by observing the appearance of each specimen.

(4) Evaluation of Adhesion (Peel Strength)

The copper-clad laminated sheets were individually immersed in a copper etching liquid to form copper foils with a width of 1 cm to obtain specimens for evaluation, and peel strength of each of the obtained specimens was measured using a rheometer.

(5) Measurement of Glass Transition Temperature

The copper-clad laminated sheets were individually immersed in a copper etching liquid to remove the copper foils to obtain specimens for evaluation, and the thermal expansion properties of each specimen was observed under a condition of temperature rising speed 5° C./min, load 0.05N, Expansion Method, range of temperature measurement from 2- to 250° C. using a TMA (Test Mechanical Analyzer) test machine, TMA2940 manufactured by DuPont. The temperature at the refraction point of the thermal expansion curve was deemed to be a glass transition temperature of each of the obtained specimens.

The results were shown in Tables 1 and 2 (Examples) and Tables 3 and 4 (Comparative Examples).

EXAMPLES 13 to 18 COMPARATIVE EXAMPLES 10 to 16

Those obtained from Synthesis Examples 1 to 8 (1-1 to 1-8) and Comparative Synthesis Examples 1 and 2 (a-1 or a-2), Synthesis Examples 9 and 10 (2-1 or 2-2), Synthesis Example 11 (semi-IPN), optionally component (3) epoxy resin and/or isocyanurate compound, and triethylamine, zinc naphthenate, 2,5-dimethyl-2,5-di(t-butylperoxy)-3-hex-3-en, and/or para-cumylphenol as curing reaction catalysts were mixed together in accordance with the formulations (part(s) by weight) shown in Tables 5 and 6 to obtain uniform varnishes.

Then, the obtained varnishes were individually applied to a PET film, and dried by heating at 160° C. for 10 minutes and the solids were removed by casting. Then, the solids removed were pressed at a pressure of 25 kg/cm$^2$ at 185° C. for 90 minutes to obtain a resin plate. Using the thus obtained resin plate, a dielectric constant (1 GHz), a dielectric dissipation factor (1 GHz), and a glass transition temperature were measured according to the following methods.

(6) Measurement of Dielectric Constant and Dielectric Dissipation Factor With Respect to Resin Sheet With respect to each of the obtained resin sheets, a dielectric constant and a dielectric dissipation factor were measured at a frequency of 1 GHz using a dielectric constant measurement apparatus (trade name: HP4291B), manufactured by Hewlett-Packard Company.

(7) Measurement of Glass Transition Temperature

The thermal expansion properties for each of the obtained resin sheets was observed for the thermal expansion properties of the specimens under a condition of temperature rising speed 5° C./min, load 0.05N, Expansion Method, range of temperature measurement from 20 to 250° C. using a TMA (Test Mechanical Analyzer) test machine, TMA2940 manufactured by DuPont. The temperature at the refraction point of the thermal expansion curve was deemed to be a glass transition temperature of each of the obtained specimens.

Separately, E-glass cloth having a thickness of 0.1 mm was impregnated with each of the above varnishes, and dried by heating at 160° C. for 10 minutes to obtain a prepreg having a resin content of 55% by weight. Then, four pieces of each prepreg were stacked on one another, and disposed between 18 μm electrolytic copper foils and pressed at a pressure of 25 kg/cm$^2$ at 185° C. for 90 minutes to obtain a copper-clad laminated sheet. Using the thus obtained copper-clad laminated sheet, a dielectric constant (1 GHz), a dielectric dissipation factor (1 GHz), a moisture absorption (water absorption), resistance to soldering heat, adhesion (peel strength), and a glass transition temperature were measured or evaluated according to the same methods as those used in the above Examples 1.

The results were shown in Table 5 (Examples) and Table 6 (Comparative Examples).

In the Tables below, components (1) to (3) are indicated by part(s) by weight, in terms of solid content.

In the Tables below, notes have the following meanings: *1: dicyclopentadiene-type epoxy resin; *2: bisphenol A novolak-type epoxy resin; *3: triethylamine; *4:8 wt % solution of zinc naphthenate; *5: para-cumylphenol; *6: biphenyl-type epoxy resin; *7: triallyl isocyanurate; and *8: 2,5-dimethyl-2,5-di(t-butylperoxy)-3-hex-3-en.

TABLE 1

| Item | | | Example 1 | Example 2 | Example 3 | Example 4 | Example 5 | Example 6 |
|---|---|---|---|---|---|---|---|---|
| Formulation (Part(s)) | Component (1) | 1–1 | 100 | — | — | 100 | 100 | 100 |
| | | 1–2 | — | 100 | — | — | — | — |
| | | 1–3 | — | — | 100 | — | — | — |
| | Component (2) | 2–1 | 200 | 200 | 200 | — | 100 | 100 |
| | | 2–2 | — | — | — | 200 | — | — |

TABLE 1-continued

| | Item | | Example 1 | Example 2 | Example 3 | Example 4 | Example 5 | Example 6 |
|---|---|---|---|---|---|---|---|---|
| | Component (3) | 1*1 | — | — | — | — | 50 | — |
| | | 2*2 | — | — | — | — | — | 50 |
| | Curing | TEA*3 | 1.0 | 1.0 | 1.0 | 1.0 | 1.0 | 1.0 |
| | catalyst | ZnNPh*4 | 0.05 | 0.05 | 0.05 | 0.05 | 0.05 | 0.05 |
| | | PCP*5 | 9.0 | 9.0 | 9.0 | 9.0 | 9.0 | 9.0 |
| Evaluation results (laminated sheet) | Dielectric constant | | 3.5 | 3.6 | 3.6 | 3.6 | 3.4 | 3.5 |
| | Dielectric dissipation factor | | 0.007 | 0.007 | 0.006 | 0.006 | 0.004 | 0.005 |
| | Water absorption (wt %) | | 0.5 | 0.5 | 0.6 | 0.4 | 0.5 | 0.4 |
| | Resistance to soldering heat | | Good | Good | Good | Good | Good | Good |
| | Peel strength (kN/m) | | 1.4 | 1.4 | 1.4 | 1.4 | 1.2 | 1.2 |
| | Glass transition temperature (° C.) | | 180 | 185 | 182 | 185 | 170 | 175 |

TABLE 2

| | Item | | Example 7 | Example 8 | Example 9 | Example 10 | Example 11 | Example 12 |
|---|---|---|---|---|---|---|---|---|
| Formulation (Part(s)) | Component (1)' | 1–4 | 100 | — | — | 100 | 100 | 100 |
| | | 1–5 | — | 100 | — | — | — | — |
| | | 1–6 | — | — | 100 | — | — | — |
| | Component (2) | 2–1 | 200 | 200 | 200 | — | 100 | 100 |
| | | 2–2 | — | — | — | 200 | — | — |
| | Component (3) | 1 | 50 | 50 | 50 | — | 50 | — |
| | | 2 | — | — | — | 50 | — | 50 |
| | Curing | TEA*3 | 1.0 | 1.0 | 1.0 | 1.0 | 1.0 | 1.0 |
| | catalyst | ZnNPh*4 | 0.05 | 0.05 | 0.05 | 0.05 | 0.05 | 0.05 |
| | | PCP*5 | 9.0 | 9.0 | 9.0 | 9.0 | 9.0 | 9.0 |
| Evaluation results (laminated sheet) | Dielectric constant | | 3.5 | 3.6 | 3.6 | 3.6 | 3.4 | 3.5 |
| | Dielectric dissipation factor | | 0.005 | 0.006 | 0.005 | 0.006 | 0.004 | 0.005 |
| | Water absorption (wt %) | | 0.5 | 0.5 | 0.6 | 0.4 | 0.5 | 0.4 |
| | Resistance to soldering heat | | Good | Good | Good | Good | Good | Good |
| | Peel strength (kN/m) | | 1.4 | 1.4 | 1.4 | 1.4 | 1.2 | 1.2 |
| | Glass transition temperature (° C.) | | 180 | 185 | 182 | 185 | 170 | 175 |

TABLE 3

| | Item | | Comparative Example 1 | Comparative Example 2 | Comparative Example 3 | Comparative Example 4 | Comparative Example 5 |
|---|---|---|---|---|---|---|---|
| Formulation (Part(s)) | Component (1) | 1–1 | 100 | — | 100 | — | — |
| | | a–1 | — | — | — | 100 | — |
| | Component (2) | 2–1 | — | 100 | — | 200 | 200 |
| | | 2–2 | — | — | — | — | — |
| | Component (3) | 1*1 | 50 | 50 | — | 50 | — |
| | | 2*2 | — | — | 50 | — | — |
| | Curing | TEA*3 | 1.0 | 1.0 | 1.0 | 1.0 | 1.0 |
| | catalyst | ZnNPh*4 | — | 0.05 | — | 0.05 | 0.05 |
| | | PCP*5 | — | 9.0 | — | 9.0 | 9.0 |
| Evaluation results (laminated sheet) | Dielectric constant | | 3.5 | 4.2 | 3.6 | 3.6 | 3.8 |
| | Dielectric dissipation factor | | 0.005 | 0.012 | 0.005 | 0.006 | 0.010 |
| | Water absorption (wt %) | | 1.1 | 0.5 | 0.6 | 1.2 | 0.5 |
| | Resistance to soldering heat | | Blister | Crack | Blister | Blister | Blister |
| | Peel strength (kN/m) | | 0.1 | 1.0 | 1.0 | 1.2 | 0.4 |
| | Glass transition temperature (° C.) | | 130 | 185 | 120 | 145 | 150 |

TABLE 4

| | Item | | Comparative Example 6 | Comparative Example 7 | Comparative Example 8 | Comparative Example 9 |
|---|---|---|---|---|---|---|
| Formulation (Part(s)) | Component (1) | 1-1 | — | 100 | — | — |
| | | a-2 | 100 | — | — | 100 |
| | Component (2) | 2-1 | — | — | 100 | 200 |
| | | 2-2 | — | — | — | — |
| | Component (3) | 1 | 68 | 50 | 50 | — |
| | | 2 | — | — | — | — |
| | Curing catalyst | TEA*3 | 1.0 | 1.0 | 1.0 | 1.0 |
| | | ZnNPh*4 | — | — | 0.05 | 0.05 |
| | | PCP*5 | — | — | 9.0 | 9.0 |
| Evaluation results (laminated sheet) | Dielectric constant | | 4.5 | 3.5 | 4.2 | 3.8 |
| | Dielectric dissipation factor | | 0.020 | 0.005 | 0.012 | 0.010 |
| | Water absorption (wt %) | | 1.3 | 1.1 | 0.5 | 0.5 |
| | Resistance to soldering heat | | Blister | Blister | Crack | Blister |
| | Peel strength (kN/m) | | 0.2 | 0.1 | 1.0 | 0.4 |
| | Glass transition temperature (° C.) | | 100 | 130 | 185 | 170 |

TABLE 5

| | Item | | Example 13 | Example 14 | Example 15 | Example 16 | Example 17 | Example 18 |
|---|---|---|---|---|---|---|---|---|
| Formulation (Part(s)) | Component (1) | 1-2 | 100 | — | — | — | — | — |
| | | 1-3 | — | 100 | — | — | — | — |
| | | 1-7 | — | — | — | 100 | — | — |
| | | 1-8 | — | — | — | — | 100 | — |
| | Component (2) | 2-1 | 100 | 100 | — | 200 | 200 | — |
| | Semi - IPN of Component (1) and (2) | | — | — | 200 | — | — | 200 |
| | Component (3) | 1*6 | 50 | — | — | — | — | 50 |
| | | 2*7 | — | 50 | — | — | 50 | — |
| | Curing catalyst | TEA*3 | 1 | 1 | 1 | 1 | 1 | 1 |
| | | ZnNPh*4 | 0.2 | 0.2 | 0.4 | 0.4 | 0.4 | 0.4 |
| | | PCP*5 | 9 | 9 | 18 | 18 | 18 | 18 |
| | | P - 25B*8 | — | 2 | — | — | — | — |
| Evaluation results | Dielectric constant | a: Resin sheet | 2.9 | 2.8 | 2.8 | 2.7 | 2.8 | 2.8 |
| | | b: Laminated sheet | 3.6 | 3.5 | 3.5 | 3.5 | 3.5 | 3.5 |
| | Dielectric dissipation | a: Resin sheet | 0.0090 | 0.0030 | 0.0040 | 0.0040 | 0.0090 | 0.0040 |
| | | b: Laminated sheet | 0.0110 | 0.0050 | 0.0050 | 0.0050 | 0.0110 | 0.050 |
| | Water absorption (wt %) | | 0.5 | 0.5 | 0.6 | 0.4 | 0.5 | 0.4 |
| | Resistance to soldering heat | | Good | Good | Good | Good | Good | Good |
| | Peel strength (kN/m) | | 1.4 | 1.4 | 1.6 | 1.4 | 1.2 | 1.2 |
| | Glass transition temperature (° C.) | | 180 | 185 | 182 | 185 | 175 | 180 |

TABLE 6

| | Item | | Comparative Example 10 | Comparative Example 11 | Comparative Example 12 | Comparative Example 13 | Comparative Example 14 | Comparative Example 15 |
|---|---|---|---|---|---|---|---|---|
| Formulation (Part(s)) | Component (1)' | 1-4 | 100 | — | 100 | — | — | — |
| | | 1-5 | — | — | — | 100 | — | — |
| | | a-1 | — | — | — | — | 100 | 100 |
| | Component (2) | 2-1 | — | 100 | — | — | 200 | — |
| | | 2-2 | — | — | — | — | — | 100 |
| | Component (3) | 1*1 | 100 | 50 | — | 100 | — | — |
| | | 2*2 | — | — | 100 | — | — | — |
| | Curing catalyst | TEA*3 | 1 | 0.5 | 1 | 1 | — | — |
| | | ZnNPh*4 | — | 0.2 | — | — | 0.4 | 0.2 |
| | | PCP*5 | — | 9 | — | — | 18 | 9 |
| Evaluation results | Dielectric constant | a: Resin sheet | 3.3 | 3.5 | 3.2 | 3.3 | 2.8 | 2.8 |
| | | b: laminated sheet | 4.0 | 4.2 | 4.0 | 4.0 | 3.5 | 3.5 |
| | Dielectric dissipation | a: Resin sheet | 0.0200 | 0.0200 | 0.0200 | 0.0200 | 0.0040 | 0.0040 |
| | | b: laminated sheet | 0.0250 | 0.0250 | 0.0250 | 0.0250 | 0.0050 | 0.0050 |
| | Water absorption (wt %) | | 1.1 | 0.5 | 1.2 | 1.1 | 1.2 | 1.4 |
| | Resistance to soldering heat | | Blister | Crack | Blister | Blister | Blister | Blister |
| | Peel strength (kN/m) | | 0.1 | 1 | 0.1 | 0.1 | 0.4 | 0.2 |
| | Glass transition temperature (° C.) | | 130 | 185 | 120 | 130 | 120 | 100 |

As is apparent from Tables, Examples of the present invention are excellent in all low dielectric constant, low dielectric dissipation factor, heat resistance, moisture resistance, and adhesion to a copper foil.

In contrast, Comparative Examples are not satisfactory in all low dielectric constant, low dielectric dissipation factor, heat resistance, moisture resistance, and adhesion to a copper foil.

The thermosetting resin composition of the present invention is excellent in low dielectric constant, low dielectric dissipation factor, heat resistance, moisture resistance, and adhesion to a copper foil, and the prepreg obtained by impregnating or coating a base material with the above composition and the laminated sheet produced by subjecting the above prepreg to laminate molding are excellent in low dielectric constant, low dielectric dissipation factor, heat resistance, moisture resistance, and adhesion to a copper foil, and therefore they are useful as a printed wiring board for electronic appliance.

What is claimed is:

1. A thermosetting resin composition comprising:
   (1) a copolymer resin comprising (a) a monomer unit represented by the following general formula (I):

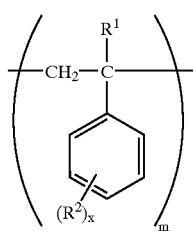

(I)

wherein $R^1$ represents a hydrogen atom, a halogen atom, or a hydrocarbon group having 1 to 5 carbon atoms; $R^2$ or each of $R^2$'s independently represents a halogen atom, an aliphatic hydrocarbon group having 1 to 5 carbon atoms, or an aromatic hydrocarbon group; x is an integer of 0 to 3; and m is a natural number, and
   (b) a monomer unit represented by the following general formula (II):

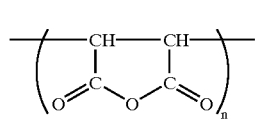

(II)

wherein n is a natural number; and
   (2) a thermosetting resin which is cured together with said component (1),
   wherein a cured product of said composition has a dielectric constant of 3.0 or less at a frequency of 1 GHz or more and has a glass transition temperature of 170° C. or more.

2. The thermosetting resin composition according to claim 1, wherein said component (2) is (2)' a cyanate resin having two or more cyanate groups per molecule.

3. A thermosetting resin composition comprising:
   (1) a copolymer resin comprising
      (a) a monomer unit represented by the following general formula (I):

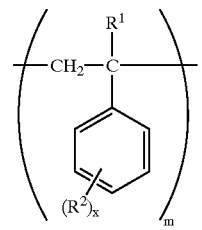

(I)

wherein $R^1$ represents a hydrogen atom, a halogen atom, or a hydrocarbon group having 1 to 5 carbon atoms; $R^3$ or each of $R^2$'s independently represents a halogen atom, an aliphatic hydrocarbon group having 1 to 5 carbon atoms, an aromatic hydrocarbon group, or a hydroxyl group; x is an integer of 0 to 3; and m is a natural number, and
      (b) a monomer unit represented by the following general formula (II):

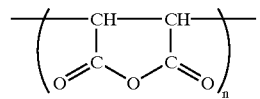

(II)

wherein n is a natural number; and
   (2)' a cyanate resin having at least two cyanate groups per molecule,
   wherein a cured product of said composition has a dielectric constant of 3.0 or less at a frequency of 1 GHz or more and has a glass transition temperature of 170° C. or more.

4. The thermosetting resin composition according to claim 1, which comprises 100 parts by weight of said component (1) and 10 to 300 parts by weight of said component (2).

5. The thermosetting resin composition according to claim 1, wherein the copolymerization ratio mm between the monomer units in said component (1) is from 0.8 to 19.

6. The thermosetting resin composition according to claim 1, wherein said x in said component (1) is 0.

7. The thermosetting resin composition according to claim 1, wherein said component (1) further comprises, as a monomer unit, (c) N-phenylmaleimide represented by the following general formula (III):

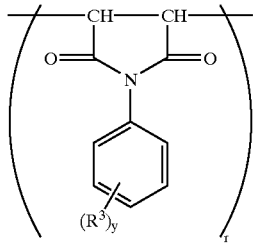

(III)

wherein $R^3$ a halogen atom, an aliphatic hydrocarbon group having 1 to 5 carbon atoms, an aromatic hydrocarbon group, a hydroxyl group, a thiol group, or a carboxyl group; y is an integer of 0 to 3; and r is a natural number, and/or a derivative thereof.

8. The thermosetting resin composition according to claim 7, wherein the copolymerization ratio m/(n+r) between the monomer units in said component (1) is from 0.8 to 19.

9. The thermosetting resin composition according to claim 8, wherein the copolymerization ratio n/r between the monomer units in said component (1) is from 1/49 to 49.

10. The thermosetting resin composition according to claim 1, further comprising (3) an epoxy resin and/or an isocyanurate compound.

11. A prepreg using the thermosetting resin composition according to claim 1.

12. A laminated sheet formed using the prepreg according to claim 11 by laminate molding.

13. The thermosetting resin composition according to claim 1, wherein the dielectric constant of the cured product of said composition is in a range of 2.2 to 3.0.

14. The thermosetting resin composition according to claim 13, wherein the dielectric constant is in a range of 2.4 to 2.9.

15. The thermosetting resin composition according to claim 14, wherein the glass transition temperature of the cured product of said composition is in a range of 175 to 220° C.

16. The thermosetting resin composition according to claim 13, wherein the glass transition temperature of the cured product of said composition is in a range of 170 to 230° C.

17. The thermosetting resin composition according to claim 1, wherein the glass transition temperature of the cured product of said composition is in a range of 170 to 230° C.

18. The thermosetting resin composition according to claim 4, which comprises 100 parts by weight of said component (1) and 50 to 300 parts by weight of said component (2).

19. The thermosetting resin composition according to claim 4, which comprises 100 parts by weight of said component (1) and 50 to 250 parts by weight of said component (2).

20. The thermosetting resin composition according to claim 3, which comprises 100 parts by weight of said component (1) and 10 to 300 parts by weight of said component (2).

21. The thermosetting resin composition according to claim 3, wherein the copolymerization ratio mm between the monomer units in said component (1) is from 0.8 to 19.

22. The thermosetting resin composition according to claim 3, wherein said x in said component (1) is 0.

23. The thermosetting resin composition according to claim 3, wherein said component (1) further comprises, as a monomer unit, (c) N-phenylmaleimide represented by the following general formula (III):

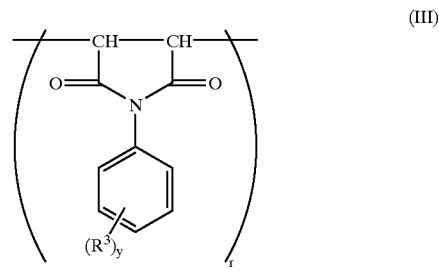

wherein $R^3$ represents a halogen atom, an aliphatic hydrocarbon group having 1 to 5 carbon atoms, an aromatic hydrocarbon group, a hydroxyl group, a thiol group, or a carboxyl group; y is an integer of 0 to 3; and r is a natural number, and/or a derivative thereof.

24. The thermosetting resin composition according to claim 23, wherein the copolymerization ratio m/(n+r) between the monomer units in said component (1) is from 0.8 to 19.

25. The thermosetting resin composition according to claim 24, wherein the copolymerization ratio n/r between the monomer units in said component (1) is from 1/49 to 49.

26. The thermosetting resin composition according to claim 3, further comprising (3) an epoxy resin and/or an isocyanurate compound.

27. A prepreg using the thermosetting resin composition according to claim 3.

28. A laminated sheet formed using the prepreg according to claim 27, by laminate molding.

29. The thermosetting resin composition according to claim 23, wherein the copolymerization ratio n/r between the monomer units in said component (1) is from 1/49 to 49.

30. The thermosetting resin composition according to claim 7, wherein the copolymerization ratio n/r between the monomer units in said component (1) is from 1/49 to 49.

* * * * *